(12) United States Patent
Felcman et al.

(10) Patent No.: US 6,945,412 B2
(45) Date of Patent: Sep. 20, 2005

(54) SYSTEM AND METHOD FOR MOUNTING A KEYBOARD AND DISPLAY ASSEMBLY IN A 1U RACK SPACE

(75) Inventors: Chris Felcman, Spring, TX (US); Kristine Little, Houston, TX (US); David Eichberger, Houston, TX (US); Gary Landrum, Montgomery, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/621,793

(22) Filed: Jul. 16, 2003

(65) Prior Publication Data

US 2004/0016709 A1 Jan. 29, 2004

Related U.S. Application Data

(63) Continuation of application No. 09/873,947, filed on Jun. 4, 2001, now abandoned.

(51) Int. Cl.[7] .................................................. A47F 7/00
(52) U.S. Cl. ...................... 211/26; 312/223.2; 211/175
(58) Field of Search .......................... 211/26, 151, 175; 312/223.1, 223.2; D14/314, 315, 320, 325, 326, 327

(56) References Cited

U.S. PATENT DOCUMENTS

| | | | | |
|---|---|---|---|---|
| 3,133,768 A | * | 5/1964 | Klakovich | 384/17 |
| 5,388,032 A | * | 2/1995 | Gill et al. | 700/17 |
| D360,622 S | * | 7/1995 | Shin et al. | D14/325 |
| D374,662 S | * | 10/1996 | Soderburg | D14/335 |
| 5,594,617 A | * | 1/1997 | Foster et al. | 361/679 |
| 5,833,337 A | * | 11/1998 | Kofstad | 312/334.5 |
| 6,008,986 A | * | 12/1999 | Mok | 361/687 |
| 6,021,047 A | * | 2/2000 | Lopez et al. | 361/727 |
| 6,123,203 A | * | 9/2000 | Gibbons | 211/26 |
| 6,142,590 A | * | 11/2000 | Harwell | 312/223.1 |
| 6,163,452 A | * | 12/2000 | O'Neal et al. | 361/681 |
| 6,181,549 B1 | * | 1/2001 | Mills et al. | 361/683 |
| 6,185,092 B1 | * | 2/2001 | Landrum et al. | 361/683 |
| 6,201,690 B1 | * | 3/2001 | Moore et al. | 361/683 |
| 6,210,211 B1 | | 4/2001 | Landrum et al. | |
| 6,220,456 B1 | * | 4/2001 | Jensen et al. | 211/26 |
| 6,279,754 B1 | * | 8/2001 | Hoss et al. | 211/26 |
| 6,307,740 B1 | * | 10/2001 | Foster et al. | 361/683 |
| 6,442,030 B1 | | 8/2002 | Mammoser et al. | |
| 6,685,033 B1 | * | 2/2004 | Baddour et al. | 211/26 |
| 2001/0031453 A1 | * | 10/2001 | Sikat et al. | 434/322 |

* cited by examiner

Primary Examiner—Jennifer E. Novosad

(57) ABSTRACT

A rack mount computing system having a keyboard and display assembly mountable in a 1 U rack space. The keyboard and display assembly are provided in a clamshell configuration to reduce space consumption of the keyboard and display assembly to facilitate mounting in the 1 U rack space.

40 Claims, 3 Drawing Sheets

SYSTEM AND METHOD FOR MOUNTING A KEYBOARD AND DISPLAY ASSEMBLY IN A 1U RACK SPACE

This is a continuation of application Ser. No. 09/873,947, filed Jun. 4, 2001, now abandoned.

BACKGROUND OF THE INVENTION

The present technique relates generally to the field of computer systems and, more specifically, to space saving techniques for a rack mount computing system. The present technique provides a display and keyboard assembly mountable in a 1 U thick rack space of the rack mount computing system.

BACKGROUND OF THE RELATED ART

This section is intended to introduce the reader to various aspects of art which may be related to various aspects of the present invention which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Servers and various other computer systems often utilize rack structures to assemble and integrate network devices, input/output devices, computing circuitry (e.g., processors, memory, motherboards, etc.) and other desired components. For a specific application, the rack structure may have one or more standard dimensions to facilitate compatibility and uniformity among the various components. An industry standard dimension of 1 U=1¼ inch is often used to characterize the amount of vertical space a particular component consumes in the rack. In other words, the standard dimension of 1 U is used to characterize the thickness of rack mountable components and to characterize the amount of vertical space that a component consumes in the rack. For example, a typical component may consume 2 U or 3 U of vertical space in the rack. A typical rack mount computer system may include a significant number of components, yet the rack generally has a limited amount of space for mounting these components. In addition, a standard rack may be 17¾ inches wide and 19 inches deep, and these dimensions also may figure into the amount of space available for mounting components.

User interaction devices, such as monitors and keyboards, are often needed to interact with various components of the rack mount computer system. The conventional configuration of these user interaction devices consumes 2 U, 3 U, or even more vertical space in the rack. The monitors used in these conventional configurations are typically desktop configured panel displays, which are generally too thick for a 1 U rack space. For example, the conventional configuration may have a 1 U keyboard and a 2 U display positioned one behind the other in a 2 U or 3 U thick rack space. This configuration also generally consumes the entire depth of the rack space, leaving no space for additional components adjacent the user interaction devices in the rack space.

Accordingly, it would be advantageous to have a technique to mount user interaction devices into a 1 U thick rack space. It would also be advantageous to have a technique for reducing depth space consumption of user interaction devices disposed in the 1 U thick rack space.

SUMMARY OF THE INVENTION

Certain aspects commensurate in scope with the originally claimed invention are set forth below. It should be understood that these aspects are presented merely to provide the reader with a brief summary of certain forms the invention might take and that these aspects are not intended to limit the scope of the invention. Indeed, the invention may encompass a variety of aspects that may not be set forth below.

In accordance with one aspect of the present invention, a rack mount computing system having a keyboard and display assembly is provided in a compact configuration for mounting in a computer rack using only a 1 U thick rack space. The keyboard and display assembly also may be provided in a clamshell configuration to reduce space requirements for mounting in the computer rack.

According to another aspect of the present technique, a rack mountable device is provided for a mount computing system. The rack mountable device includes a user interaction assembly mountable in a 1 U thick rack space of the rack mount computing system. The user interaction assembly has an input device and a panel display rotatably disposed adjacent the input device.

According to yet another aspect of the present technique, a method is provided for mounting a keyboard and a display in a rack mount computer system. The method includes disposing a keyboard and a display in a 1 U rack space. The method also includes coupling a hinge assembly to the display and providing the keyboard and the display in a clamshell configuration.

BRIEF DESCRIPTION OF THE DRAWINGS

Exemplary embodiments of the invention will hereafter be described with reference to the accompanying drawings, wherein like reference numerals denote like elements, and.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
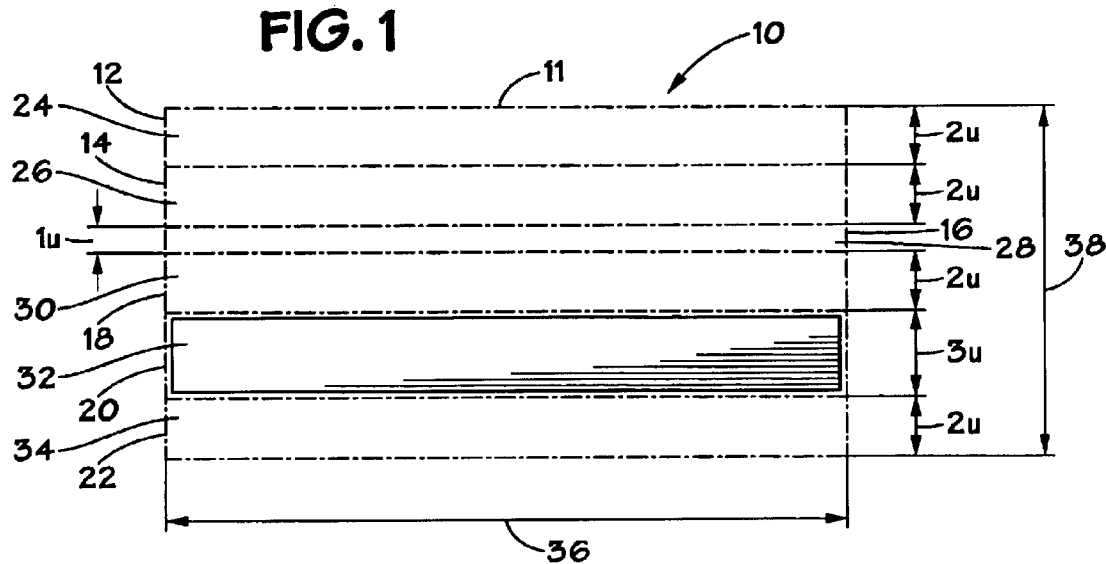
FIG. 1 is a front view of an exemplary rack mount computing system of the present technique.
Figure 2:
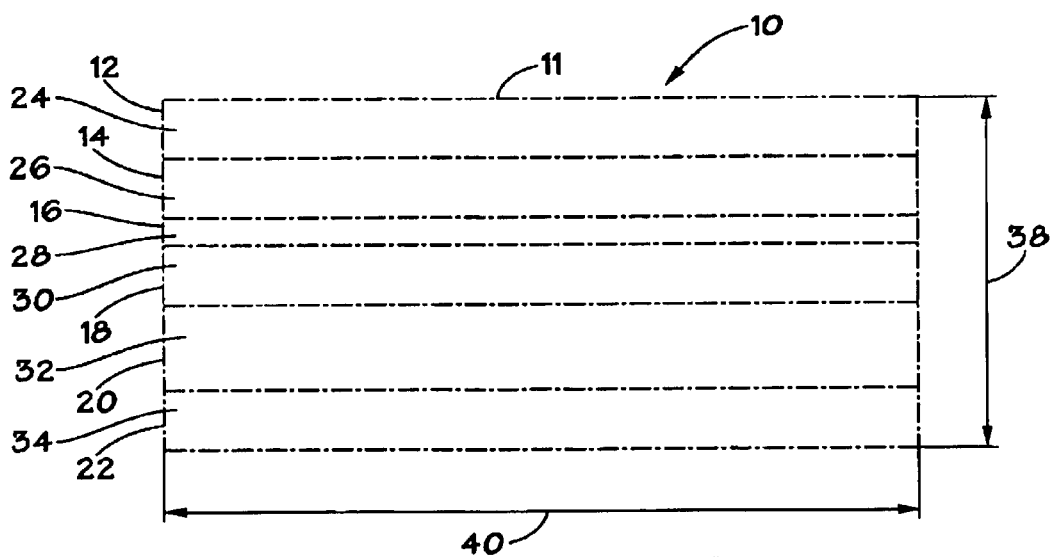
FIG. 2 is a side view of the rack mount computing system.

The present technique relates generally to rack mountable devices and space saving techniques for rack mount computing systems. FIGS. 1 and 2 are front and side views, respectively, of an exemplary rack mount computing system

10 of the present technique. As illustrated, the rack mount computing system 10 includes a rack 11 having a plurality of bays for rack mountable devices. For example, the rack 11 may include bays 12, 14, 16, 18, 20 and 22 to support rack mountable devices 24, 26, 28, 30, 32 and 34, respectively.

Each of the rack mountable devices 24-34 has specific dimensions (e.g., depth, width and height), which may be tailored to the dimensions of the rack 11 to facilitate mounting in the rack 11 or vice versa. The rack 11 may have standard or custom dimensions (e.g. a width 36, a height 38, and a depth 40), which can vary depending on the particular industry and application. For example, the rack 11 may have a 17¾ inch width 36 and a 19 inch depth 40 for a server rack system. Accordingly, the specific dimensions of the rack mountable devices 24–34 are adapted to the dimensions of the rack 11. The dimensions of the rack 11 and the rack mountable devices 24–34 also may be specified in an industry standard unit, such as "U", which corresponds to 1¾ inches.

As illustrated, the bays 12–22 and the corresponding rack mountable devices 24-34 have heights of 2 U, 2 U, 1 U, 2 U, 3 U and 2 U, respectively. Although the rack mountable devices 24–34 (e.g., particularly user input devices) typically consume 2 U or more of vertical space, the present technique facilitates mounting of the rack mountable device 28 in a 1 U rack space. It should also be noted that the rack mountable devices 24–34 may be directly mounted in the rack 11 or they may be disposed on trays or other mounting structures. In either case, the rack mountable devices 24–34 may be fixedly or movably coupled to the rack 11. For example, the bays 12–22 may have slidable mounting assemblies (e.g., wheel and rail assemblies) to facilitate slidable insertion, removal, and access to the rack mountable devices 24–34.

Figure 3:
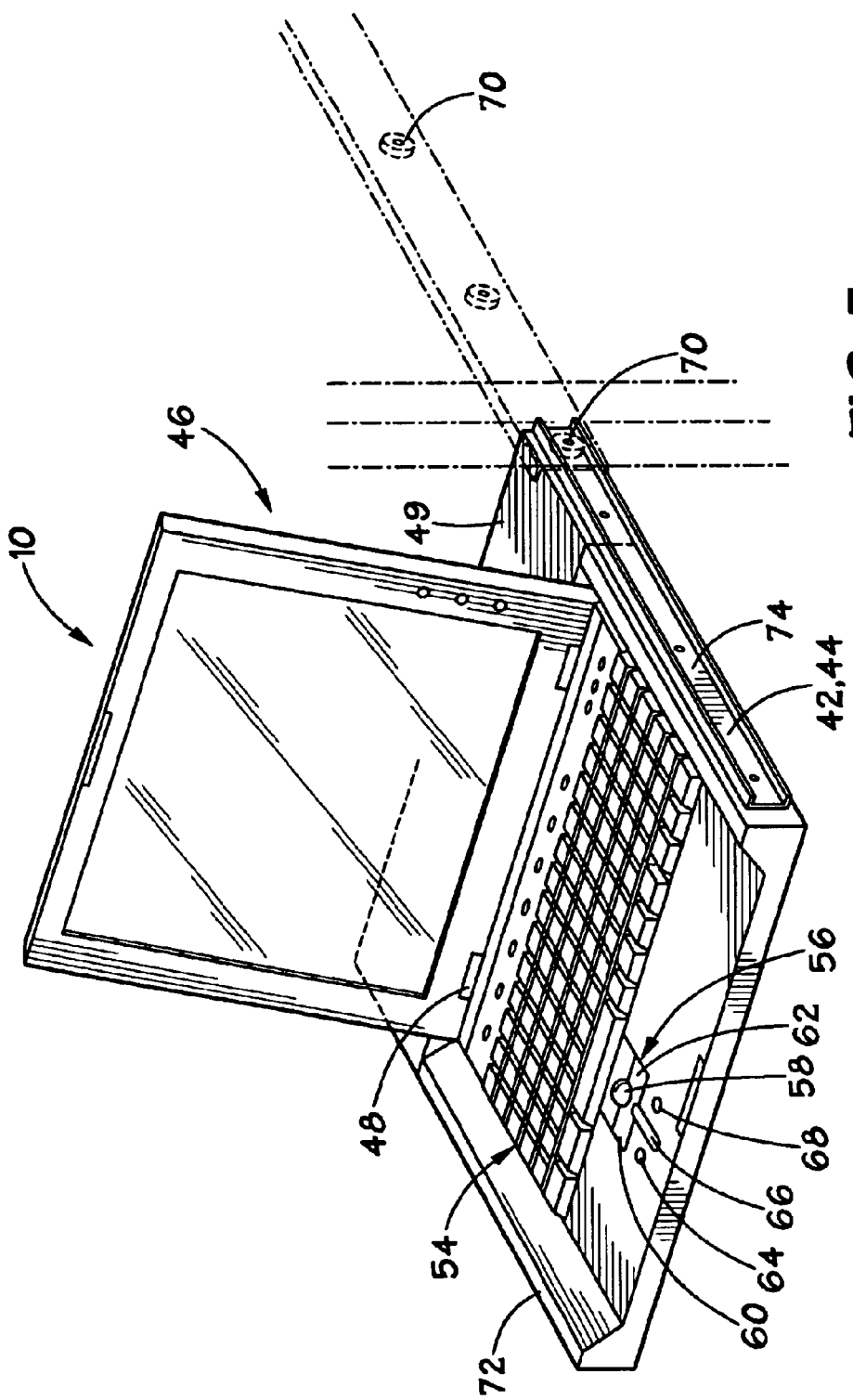
FIG. 3 is a perspective view of a rack mountable device having a keyboard and a display.

FIG. 3 is a perspective view of an exemplary rack mountable device 28. The device 28 includes an input device 42 such as a keyboard. A component housing 44 may surround and protect input device 42. A display 46 includes a hinge assembly 48 that rotatably couples the display 46 to the input device 42 and the component housing 44. Alternatively, the input device 42, the component housing 44, and the display 46 may be separate components disposed in a rack mountable tray for insertion into the bay 16. The component housing 44 also may extend behind the hinge assembly 48, or a component housing 49 may be disposed adjacent the component housing section 44. The component housing 44 and the component housing section 49 may house a plurality of computing circuitry and components, such as a processor, memory, disk drives, communication devices, audio/video devices, and other suitable devices. However, the rack mountable device 28 may simply have a video controller and input device circuitry disposed in the housing 44 and 49.

The display 46 is rotatable about the hinge assembly 48 to a desired viewing orientation for operation or to a closed configuration for storage in the bay 16. As illustrated, the rack mountable device 28 is oriented in an open configuration having the display 46 in an upright orientation relative to the input device 42. The rack mountable device 28 can also be oriented in closed or clamshell configuration in which the display 46 is disposed over, or nested within, the input device 42.

In this closed configuration, or in an alternate configuration having the display 46 and input device 42 disposed one behind the other, the rack mountable device 28 has a relatively thin thickness mountable in a 1 U or thinner rack space, such as the bay 16. It should also be noted that the keyboard 54 and the coordination device 56 are vertically recessed from a top edge of the sides 72 and 74 such that the display 46 can be nested within the input device 42 in a closed configuration. This relatively thin thickness of the rack mountable device 28 may be attributed to the clamshell configuration and the relatively thin thicknesses of the display 46 and the input device 42. The rack mountable device 28 also has a width, which may be less than 21 inches (e.g., 17.5 inches or between 10.5 inches and 21 inches), suitable for insertion into the width 36 of the rack 11. The rack mountable device 28 also has a depth, which may be less the 19.25 inches (e.g., 15.75 inches) in the clamshell configuration, suitable for insertion into the depth 40 of the rack 11.

The input device 42 includes a keyboard 54 adjacent a coordination device 56, which includes a track ball 58, buttons 60 and 62, and scroll buttons 64, 66, and 68. The scroll buttons 64, 66, and 68 are provided to facilitate horizontal and vertical scrolling in a graphical user interface, such as in a program having horizontal and vertical scroll bars. The scroll buttons 64 and 68 can be depressed to scroll left and right, respectively, while the scroll button 66 can be depressed on an upper or lower portion for upward and downward scrolling, respectively.

The display 46 includes a flat panel display screen 69, which has a relatively thin thickness, typically less than ½ U, that is comparable to, or thinner than, a laptop or a portable computer display assembly. The display screen 69 may be a liquid crystal display, or it may be any other suitable flat or slim profile display assembly.

The rack mountable device 28 also has wheels 70 disposed on opposite sides 72 and 74 to facilitate slidable mounting into the bay 16 of the rack 11. Any other suitable fixed or movable mount mechanism can also be used within the scope of the present technique. For example, the rack 11 or the rack mountable device 28 may have a motor assisted linear positioning assembly.

Figure 4:
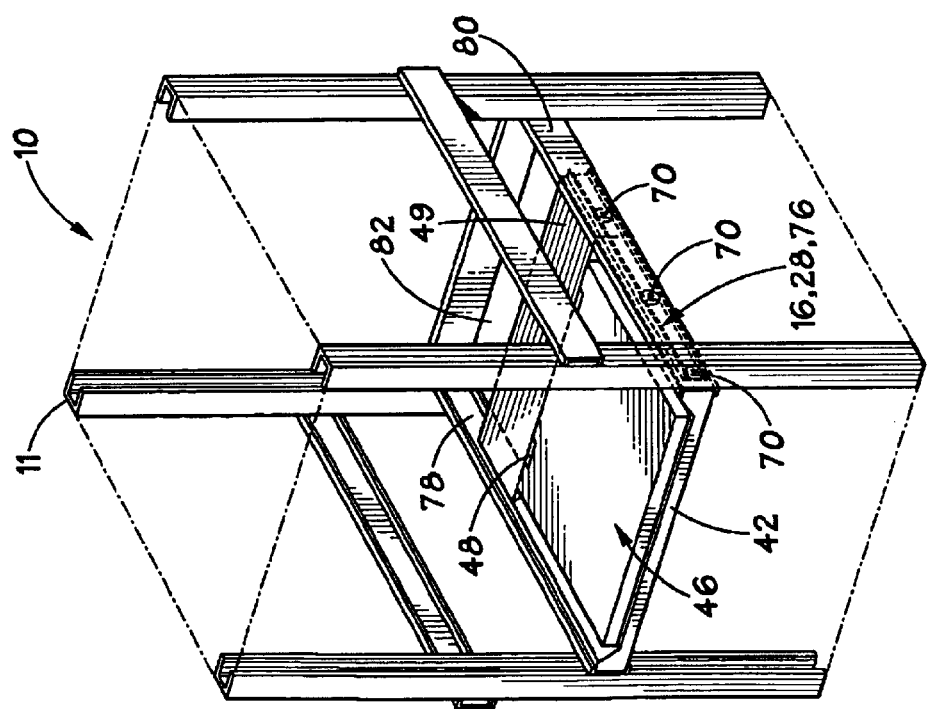
FIG. 4 is a perspective view of the rack mountable device in a closed configuration mounted in a 1 U rack space of the rack mount computing system.

FIG. 4 is a perspective view of the rack mount computing system 10 having the rack mountable device 28 slidably mounted into the bay 16 in a closed configuration 76 (e.g., a closed clamshell configuration). As illustrated, the closed configuration 76 has the display 46 rotated about the hinge assembly 48 to a position adjacent the input device 42 and covering both the keyboard 54 and the graphical coordination device 56. In this closed configuration 76, the rack mountable device 28 has a thickness of 1 U or less to facilitate mounting in a 1 U thick bay, such as the bay 16 of the rack 11. Accordingly, the closed configuration 76 reduces the space requirements for mounting a display and keyboard assembly in the rack mount computing system 10.

Also note that the wheels 70 of the rack mountable device 28 are slidable along rails 78 and 80 on opposite sides of the rack 11. The present technique also reduces space consumption to provide a space 82 in the bay 16 adjacent the rack mountable device 28 by utilizing the closed configuration 76. Alternatively, the rack mountable device 28 may be configured in an open configuration having the display 46 rotated about the hinge assembly 48 to a position 180 degrees relative to the closed configuration 76. In this closed configuration, the space 82 may be consumed by the rack mountable device 28, but the overall thickness of the rack mountable device 28 may be considerably reduced to less than 1 U (e.g., ½ U or ¾ U).

Figure 5:
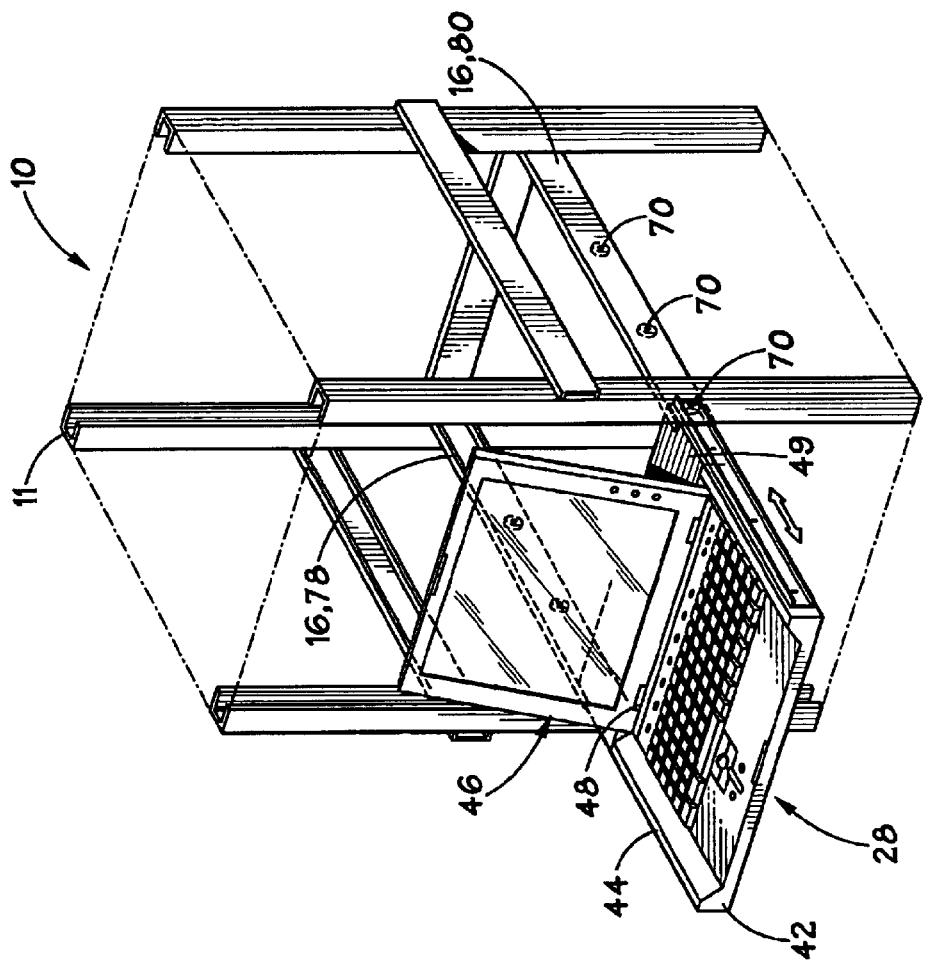
FIG. 5 is a perspective view of the rack mountable device in an open configuration partially removed from the 1 U rack space to facilitate user interaction with the rack mount computing system.

FIG. 5 is a perspective view of the rack mount computing system 10 having the rack mountable device 28 partially removed from the bay 16 and positioned in the open configuration 50, as illustrated in FIG. 3. Accordingly, the rack mountable device 28 is utilized by sliding the rack mountable device 28 in and out of the bay 16 along the rails 78 and 80 and by rotating the display 46 about the hinge assembly 48. To store the rack mountable device 28 in a non-user interaction state, the display 46 can be rotated about the hinge assembly 48 to the closed configuration 76 and can be slidably inserted into the bay 16 along the rails 78 and 80. If a user desires interaction with the rack mount computing system 10, then the rack mountable device 28 can be slidably removed from the bay 16 and the display 46 can be rotated about the hinge assembly 48 away from the input device 42 and toward the open configuration 50, as illustrated in FIG. 5.

While the invention may be susceptible to various modifications and alternative forms, specific embodiments have been shown by way of example in the drawings and have been described in detail herein. However, it should be understood that the invention is not intended to be limited to the particular forms disclosed. For example, the present technique may be applied to a variety of computing systems, computing components, and other electronic and computing devices, each having various components and features. The present technique also may use a variety of mounting structures to position the particular device in the desired location. Accordingly, the invention is intended to cover all modifications, equivalents, and alternatives falling within the spirit and scope of the invention as defined by the following appended claims.

What is claimed is:

1. A rack mount computing system, comprising:
   a rack structure having a plurality of 1 U rack spaces for mounting computing devices; and
   a user interaction assembly disposed in one of the plurality of 1 U rack spaces and having a height of no more than 1 U, comprising:
   an input device; and
   a display rotatably disposed adjacent the input device.

2. The rack mount computing system of claim 1, wherein the input device comprises a keyboard.

3. The rack mount computing system of claim 1, wherein the display comprises a flat panel display assembly.

4. The rack mount computing system of claim 1, wherein the input device and the display are rotatable between open and closed orientations in a clamshell configuration.

5. The rack mount computing system of claim 4, wherein the closed orientation has the display nested within the input device.

6. The rack mount computing system of claim 4, wherein the closed orientation is mountable within the height of 1 U.

7. The rack mount computing system of claim 6, wherein the closed orientation has the display nested within the input device.

8. The rack mount computing system of claim 1, wherein the user interaction assembly comprises a component housing disposed adjacent the keyboard, the component housing comprising a video control assembly for the display.

9. The rack mount computing system of claim 1, wherein the user interaction assembly has a width of between 10.5 inches and 21 inches.

10. The rack mount computing system of claim 9, wherein the display is less than ½ U thick.

11. The rack mount computing system of claim 10, wherein the input device is less than ¾ U thick.

12. The rack mount computing system of claim 1, comprising at least one computing device mounted in the rack structure.

13. A method for rack mounting a keyboard and a display in a rack mount computer system, comprising the act of:
   disposing a keyboard and a display in a 1 U rack space of the rack mount computer system.

14. The method of claim 13, wherein the act of disposing the keyboard and the display in the 1 U rack space comprises the act of:
   providing a graphical coordination device adjacent the keyboard.

15. The method of claim 13, wherein the act of disposing the keyboard and the display in the 1 U rack space comprises the act of:
   providing the keyboard with a thickness of less than ¾ U.

16. The method of claim 13, wherein the act of disposing the keyboard and the display in the 1 U rack space comprises the act of:
   providing the display with a thickness of less than ½ U.

17. The method of claim 13, wherein the act of disposing the keyboard and the display in the 1 U rack space comprises the act of:
   disposing the keyboard and the display in a server rack.

18. The method of claim 13, wherein the act of disposing the keyboard and the display in the 1 U rack space comprises the act of:
   providing a closed clamshell configuration for storage of the keyboard and the display in the 1 U rack space.

19. The method of claim 18, wherein the act of providing the closed clamshell configuration comprises the act of:
   nesting the display within the keyboard.

20. The method of claim 13, wherein the act of disposing the keyboard and the display in the 1 U rack space comprises the act of:
   providing an open clamshell configuration for operation of the keyboard and the display in an operational orientation of the keyboard and the display that is at least partially withdrawn from the 1 U rack space.

21. A rack mount computing system, comprising:
   a rack structure having a plurality of 1 U rack spaces for mounting computing devices; and
   a user interaction assembly disposed in one of the plurality of 1 U rack spaces and having a height of no more than 1 U, the user interaction assembly consisting essentially of:
   an input device; and
   a display rotatably disposed adjacent the input device.

22. The rack mount computing system of claim 21, wherein the input device is a keyboard.

23. The rack mount computing system of claim 21, wherein the display is a flat panel display assembly.

24. The rack mount computing system of claim 21, wherein the input device and the display are rotatable between open and closed orientations in a clamshell configuration.

25. The rack mount computing system of claim 24, wherein the closed orientation has the display nested within the input device.

26. The rack mount computing system of claim 24, wherein the closed orientation is mountable within the height of 1 U.

27. The rack mount computing system of claim 26, wherein the closed orientation has the display nested within the input device.

28. The rack mount computing system of claim 21, wherein the user interaction assembly includes a component housing disposed adjacent the keyboard, the component housing comprising a video control assembly for the display.

29. The rack mount computing system of claim 21 wherein the user interaction assembly has a width of between 10.5 inches and 21 inches.

30. The rack mount computing system of claim 29, wherein the display is less than ½ U thick.

31. The rack mount computing system of claim 30, wherein the input device is less than ¾ U thick.

32. The rack mount computing system of claim 21, wherein the rack structure includes at least one computing device being mounted therein.

33. A method for rack mounting a keyboard and a display in a rack mount computer system, consisting essentially of the act of:

disposing an input device and a display in a 1 U rack space of the rack mount computer system.

34. The method of claim 33, wherein the act of disposing the input device and the display in the 1 U rack space includes the act of:

providing a graphical coordination device adjacent the input device.

35. The method of claim 33, wherein the act of disposing the input device and the display in the 1 U rack space includes the act of: providing a keyboard with a thickness of less than ¾ U.

36. The method of claim 33, wherein the act of disposing the input device and the display in the 1 U rack space includes the act of:

providing the display with a thickness of less than ½ U.

37. The method of claim 33, wherein the act of disposing the input device and the display in the 1 U rack space includes the act of:

disposing the input device and the display in a server rack.

38. The method of claim 33, wherein the act of disposing the input device and the display in the 1 U rack space includes the act of:

providing a closed clamshell configuration for storage of the input device and the display in the 1 U rack space.

39. The method of claim 38, wherein the act of providing the closed clamshell configuration includes the act of:

nesting the display within a keyboard.

40. The method of claim 33, wherein the act of disposing the input device and the display in the 1 U rack space includes the act of:

providing an open clamshell configuration for operation of a keyboard and the display in an operational orientation of the keyboard and the display that is at least partially withdrawn from the 1 U rack space.

* * * * *